United States Patent
Lee et al.

(10) Patent No.: US 9,825,176 B2
(45) Date of Patent: Nov. 21, 2017

(54) METHOD OF MANUFACTURING A DUAL-GATE THIN FILM TRANSISTOR

(71) Applicant: SAMSUNG DISPLAY CO., LTD., Yongin-si, Gyeonggi-do (KR)

(72) Inventors: Yul-Kyu Lee, Yongin-si (KR); Kyu-Sik Cho, Yongin-si (KR); Sun Park, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 15/141,325

(22) Filed: Apr. 28, 2016

(65) Prior Publication Data
US 2016/0240688 A1    Aug. 18, 2016

Related U.S. Application Data

(62) Division of application No. 14/050,825, filed on Oct. 10, 2013, now Pat. No. 9,343,577.

(30) Foreign Application Priority Data

May 21, 2013 (KR) ........................ 10-2013-0057294

(51) Int. Cl.
*H01L 29/786* (2006.01)
*H01L 27/12* (2006.01)
*H01L 29/49* (2006.01)
*H01L 29/66* (2006.01)
*H01L 27/32* (2006.01)

(52) U.S. Cl.
CPC .... *H01L 29/78645* (2013.01); *H01L 27/1222* (2013.01); *H01L 27/1274* (2013.01); *H01L 29/4908* (2013.01); *H01L 29/6675* (2013.01); *H01L 29/78675* (2013.01); *H01L 29/78696* (2013.01); *H01L 27/3262* (2013.01)

(58) Field of Classification Search
None
See application file for complete search history.

(56) References Cited

U.S. PATENT DOCUMENTS

| 5,663,077 | A * | 9/1997 | Adachi | H01L 21/28158 257/E21.192 |
| 6,624,477 | B1 * | 9/2003 | Takemura | H01L 27/1214 257/351 |
| 2013/0126973 | A1 * | 5/2013 | Arao | H01L 27/1214 257/351 |
| 2014/0291624 | A1 | 10/2014 | Kim et al. | |
| 2014/0346604 | A1 | 11/2014 | Lee et al. | |

FOREIGN PATENT DOCUMENTS

| JP | 09-113936 | 5/1997 |
| JP | 09-129891 | 5/1997 |
| JP | 09-230385 | 9/1997 |

\* cited by examiner

*Primary Examiner* — Daniel Whalen
(74) *Attorney, Agent, or Firm* — F. Chau & Associates, LLC

(57) ABSTRACT

A thin film transistor includes: a substrate, a semiconductor layer disposed on the substrate, a first gate electrode and a second gate electrode disposed on the semiconductor layer, a gate insulating layer disposed between the semiconductor layer and the first and second gate electrodes and having a first through hole between the first and second gate electrodes and a capping layer covering the first gate electrode and contacting the semiconductor layer via the first through hole. The capping layer includes a conductive material.

9 Claims, 7 Drawing Sheets

METHOD OF MANUFACTURING A DUAL-GATE THIN FILM TRANSISTOR

CROSS-REFERENCE TO RELATED APPLICATIONS

This application is a Division of Co-Pending U.S. patent application Ser. No. 14/050,825, filed on Oct. 10, 2013, which claims priority to Korean Patent Application No. 10-2013-0057294, filed on May 21, 2013 the disclosures of which are hereby incorporated by reference herein in their entirety.

TECHNICAL FIELD

The present disclosure relates to a thin film transistor, a display device including the same, and a method of manufacturing the thin film transistor, and more particularly, to a thin film transistor operable normally even when a partial insulation defect occurs in a dual-gate thin film transistor, a display apparatus including the thin film transistor, and a method of manufacturing the thin film transistor.

DISCUSSION OF THE RELATED ART

A flat panel display device such as an organic light-emitting display device includes thin film transistors on a substrate for controlling the operation of pixels. Such a thin film transistor includes a semiconductor layer, a source electrode, a drain electrode, and a gate electrode. A dual-gate thin film transistor including two gate electrodes in one transistor may be used to control the operation of each pixel.

SUMMARY

Embodiments of the present invention may prevent a pixel defect from occurring in a flat panel display device by providing a thin film transistor which operates normally even when a partial insulation defect occurs in a dual-gate thin film transistor.

Embodiments of the present invention also provide a display apparatus including the thin film transistor, and a method of manufacturing the thin film transistor.

According to an embodiment of the present invention, a thin film transistor includes: a substrate, a semiconductor layer disposed on the substrate, a first gate electrode and a second gate electrode disposed on the semiconductor layer, a gate insulating layer disposed between the semiconductor layer and the first and second gate electrodes and having a first through hole between the first and second gate electrodes and a capping layer covering the first gate electrode, and contacting the semiconductor layer via the first through hole. The capping layer includes a conductive material.

The thin film transistor may further include: a first electrode located on a side of the first gate electrode opposite to the second gate electrode, and contacting the capping layer, and a second electrode located on a side of the second gate electrode opposite to the first gate electrode and contacting the semiconductor layer.

The gate insulating layer may have a second through hole on a side of the first gate electrode opposite to the second gate electrode, and the capping layer may contact the semiconductor layer via the second through hole.

The thin film transistor may further include: a first electrode located on a side of the second through hole opposite to the first gate electrode, and contacting the semiconductor layer, and a second electrode located on a side of the second gate electrode opposite to the first gate electrode and contacting the semiconductor layer.

According to an embodiment of the present invention, a thin film transistor includes: a substrate, a semiconductor layer disposed on the substrate, a first gate electrode and a second gate electrode disposed on the semiconductor layer, a gate insulating layer disposed between the semiconductor layer and the first and second gate electrodes and having a first through hole between the first and second gate electrodes, an interlayer insulating layer covering the first gate electrode and the second gate electrodes and having a third through hole in a region between the first gate electrode and the second gate electrode, in which the third through hole corresponds to the first through hole of the gate insulating layer and a capping layer covering a region of the interlayer insulating layer corresponding to the first gate electrode and contacting the semiconductor layer via the first through hole and the third through hole. The capping layer includes a conductive material.

The thin film transistor may further include: a first electrode located on a side of the first gate electrode opposite to the second gate electrode, and contacting the capping layer, and a second electrode located on a side of the second gate electrode opposite to the first gate electrode and contacting the semiconductor layer. The capping layer and the first electrode may be integrated together.

The gate insulating layer may have a second through hole on a side of the first gate electrode opposite to the second gate electrode, the interlayer insulating layer may have a fourth through hole corresponding to the second through hole of the gate insulating layer, and the capping layer may contact the semiconductor layer via the second through hole and the fourth through hole.

The thin film transistor may further include: a first electrode located on a side of the second through hole opposite to the first gate electrode, and contacting the semiconductor layer, and a second electrode located on a side of the second gate electrode opposite to the first gate electrode and contacting the semiconductor layer. The first electrode, the second electrode, and the capping layer may include the same material as each other.

The gate insulating layer may be disposed between the first and second gate electrodes and the semiconductor layer and may be configured to cause a short between the second gate electrode and the semiconductor layer.

The first gate electrode and the second gate electrodes may have shapes protruding from a gate line, and the first gate electrode and the gate line may be physically disconnected from each other.

According to an embodiment of the present invention, a display apparatus includes: any of the above-described thin film transistors, and a display device electrically connected to the thin film transistor.

According to an embodiment of the present invention, a method of manufacturing a thin film transistor includes: forming a semiconductor layer on a substrate, forming a gate insulating layer covering the semiconductor layer, forming a first gate electrode and a second gate electrode on the gate insulating layer, forming a first through hole in a region of the gate insulating layer between the first gate electrode and the second gate electrode exposing the semiconductor layer and forming a capping layer including a conductive material covering the second gate electrode and contacting the semiconductor layer via the first through hole.

The method may further include forming a first electrode located on a side of the first gate electrode opposite to the second gate electrode and contacting the semiconductor layer, and a second electrode located on a side of the second gate electrode opposite to the first gate electrode and contacting the capping layer.

The forming of the first through hole in the gate insulating layer may include forming the first through hole in the region of the gate insulating layer between the first gate electrode and the second gate electrode exposing the semiconductor layer, and a second through hole in a region of the gate insulating layer on a side of the first gate electrode opposite to the second gate electrode exposing the semiconductor layer. The forming of the capping layer may include forming the capping layer including the conductive material covering the first gate electrode and to contacting the semiconductor layer through the first through hole and the second through hole.

The method may further include a first electrode located on a side of the second through hole opposite to the first gate electrode and contacting the semiconductor layer, and a second electrode located on a side of the second gate electrode opposite to the first gate electrode and contacting the semiconductor layer.

According to an embodiment of the present invention, a method of manufacturing a thin film transistor includes: forming a semiconductor layer on a substrate, forming a gate insulating layer covering the semiconductor layer, forming a first gate electrode and a second gate electrode on the gate insulating layer, forming an interlayer insulating layer covering the first gate electrode and the second gate electrode, forming a first through hole in a region of the gate insulating layer and the interlayer insulating layer between the first gate electrode and the second gate electrode exposing the semiconductor layer and forming a capping layer including a conductive material covering a region of the interlayer insulating layer corresponding to the first gate electrode and contacting the semiconductor layer via the first through hole.

The method may further include forming a first electrode located on a side of the first gate electrode opposite to the second gate electrode and contacting the capping layer, and a second electrode located on a side of the second gate electrode opposite to the first gate electrode and contacting the semiconductor layer.

The forming of the capping layer may include simultaneously forming the capping layer covering the region of the interlayer insulating layer corresponding to the first gate electrode and contacting the semiconductor layer via the first through hole, a first electrode integrated with the capping layer, and a second electrode located on a side of the second gate electrode opposite to the first gate electrode and contacting the semiconductor layer.

The forming of the first through hole in the gate insulating layer and the interlayer insulating layer may include forming the first through hole in the region of the gate insulating layer and the interlayer insulating layer between the first gate electrode and the second gate electrode exposing the semiconductor layer, and a second through hole in a region of the gate insulating layer and the interlayer insulating layer on a side of the first gate electrode opposite to the second gate electrode exposing the semiconductor layer. The forming of the capping layer may include forming the capping layer of the conductive material covering the region of the interlayer insulating layer corresponding to the first gate electrode and contacting the semiconductor layer via the first through hole and the second through hole.

The method may further include forming a first electrode located on a side of the second through hole opposite to the first gate electrode and contacts the semiconductor layer, and a second electrode located on a side of the second gate electrode opposite to the first gate electrode and contacting the semiconductor layer.

The forming of the capping layer and the forming of the first electrode and the second electrode may be performed at the same time.

The method may further include physically disconnecting the first gate electrode from a gate line. The physically disconnecting of the first gate electrode from the gate line may be performed using a laser beam.

In accordance with an embodiment, an organic light-emitting display apparatus is provided. The organic light-emitting display apparatus includes a thin film transistor according to an embodiment and an organic light-emitting device electrically connected to the thin film transistor.

The organic light-emitting device includes a pixel electrode disposed on the semiconductor layer, a pixel defining layer covering the thin film transistor and an edge of the pixel electrode and exposing a center region of the pixel electrode, an intermediate layer including an emission layer and disposed on the center region of the pixel electrode exposed by the pixel defining layer, an opposite electrode disposed on the intermediate layer, and an auxiliary electrode disposed on a portion of the pixel electrode underneath the second electrode.

BRIEF DESCRIPTION OF THE DRAWINGS

Exemplary embodiments of the present invention can be understood in more detail from the following description taken in conjunction with the accompanying drawings of which.

DETAILED DESCRIPTION OF EXEMPLARY EMBODIMENTS

Figure 1A:
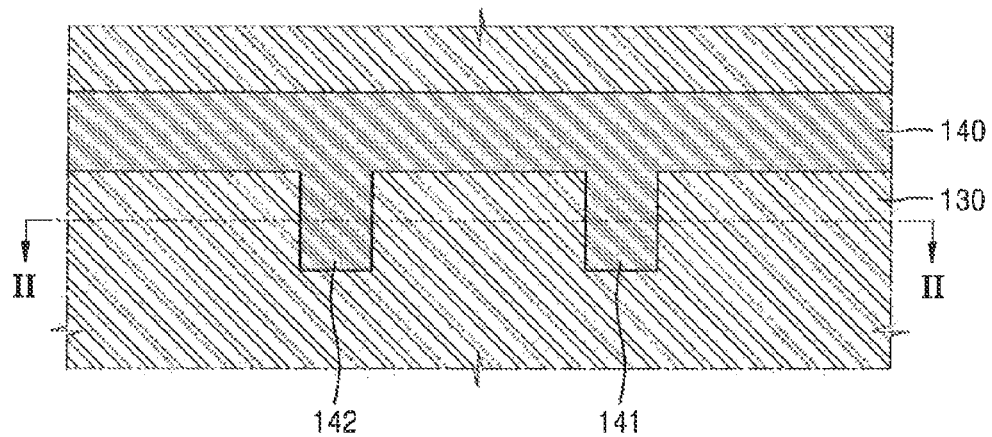
FIGS. 1A to 5 are schematic plane and cross-sectional views illustrating a method of manufacturing a thin film transistor, according to an embodiment of the present invention.

Reference will now be made in detail to embodiments, examples of which are illustrated in the accompanying drawings, wherein like reference numerals refer to the like elements throughout. In this regard, exemplary embodiments of the present embodiments may have different forms and should not be construed as being limited to the descriptions set forth herein. In the drawings, the thicknesses and sizes of layers or regions may be exaggerated or reduced for clarity and convenience of explanation. As used herein, the term "and/or" includes any and all combinations of one or more of the associated listed items. The use of the terms "a" and "an" and "the" and similar referents in the context of describing exemplary embodiments of the invention (especially in the context of the following claims) are to be construed to cover both the singular and the plural, unless otherwise indicated herein or clearly contradicted by context.

It will be understood that when an element, such as a layer, a film, a region, or a plate, is referred to as being "on" another element, it may be directly on the other element or intervening elements may be present.

A conventional dual-gate thin film transistor may not operate normally even when a short occurs between one of the two gate electrodes and a semiconductor layer. When such a defective dual-gate thin film transistor is connected to a pixel electrode, a corresponding pixel may be defective and appear as a dark point emitting no light or a light point emitting light all the time, consequently causing a failure in a flat panel display device. Embodiments of the present invention may prevent the above-mentioned pixel defects from occurring by providing a thin film transistor which operates normally even when a partial insulation defect occurs in a dual-gate thin film transistor. In addition, embodiments of the present invention also provide a display apparatus including the thin film transistor, and a method of manufacturing the thin film transistor.

FIGS. 1A to 5 are schematic plane and cross-sectional views illustrating a method of manufacturing a thin film transistor, according to an embodiment of the present invention.

Figure 1B:
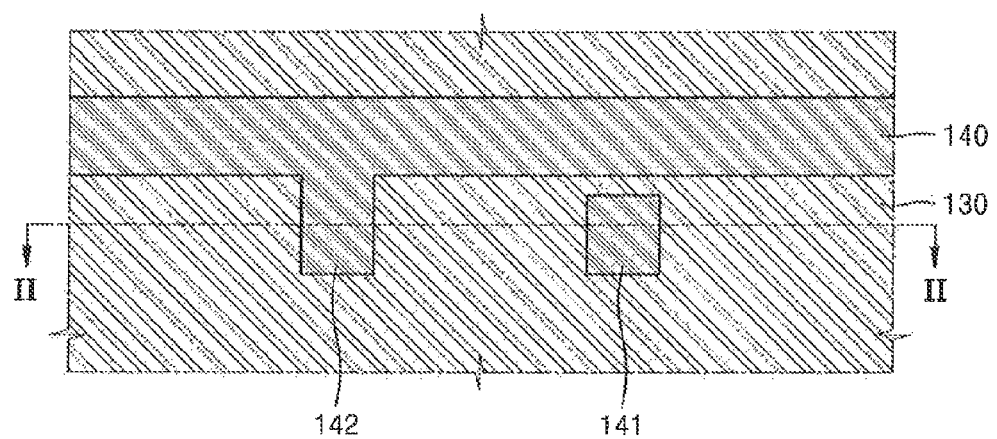
Figure 2:
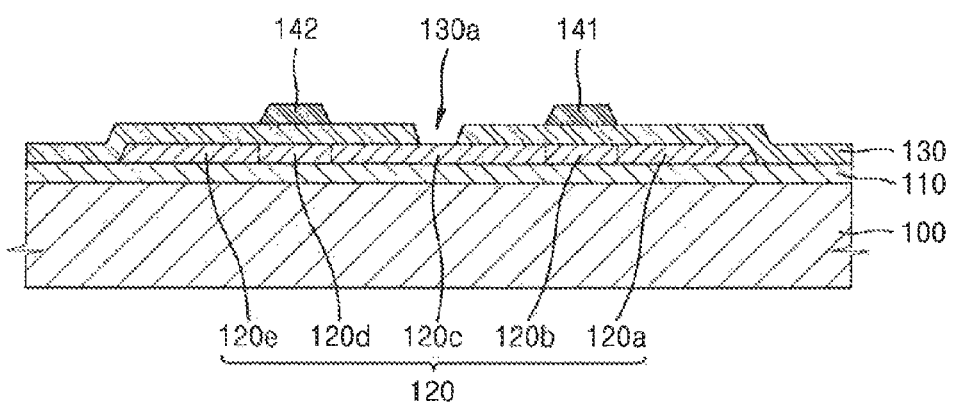

Referring to FIGS. 1A, 1B, and 2, a semiconductor layer 120 is formed on a substrate 100. The substrate 100 may be formed of, for example, transparent glass, quartz, plastic, or the like. Also, in an exemplary embodiment, the substrate 100, may be formed of, for example, ceramic or silicon materials. Further, in an exemplary embodiment, the substrate 100 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

Before the forming of the semiconductor layer 120, a buffer layer 110 may be formed of a material, such as, for example, silicon oxide, silicon nitride, or silicon oxynitride on the substrate 100 to prevent infiltration of impurities into the semiconductor layer 120. Alternatively, in an exemplary embodiment, the material for the buffer layer 110 may be an organic insulating material such as, for example, polyethylene terephthalate (PET), polyethylene naphthalate (PE N), polyacrylate, polyimide, poly siloxane, phenyl siloxane, polyamide, silsesquioxane and silane, BCB (benzocyclobutene), or an acrylic resin. The semiconductor layer 120 may include, for example, polycrystalline polysilicon, amorphous silicon (e.g. hydrogenated amorphous silicon), microcrystal silicon, or single crystal silicon. For example, in an exemplary embodiment, the semiconductor layer includes polycrystalline polysilicon which may be obtained by forming an amorphous silicon layer and crystallizing the same. The semiconductor layer 120 may be patterned into, for example, an island shape, as illustrated in FIG. 2.

At least part of the semiconductor layer 120 may be used as a capacitor electrode via doping with impurities. In this case, the semiconductor layer 120 may be patterned into a different shape from that illustrated in FIG. 2.

The semiconductor layer 120 may include, for example, a source region 120a, a first channel region 120b, a first doped region 120c, a second channel region 120d, and a drain region 120e, as illustrated in FIG. 2.

For example, the semiconductor layer 120 may include the source region 120a, the drain region 120e, and the first doped region 120c between the source region 120a and the drain region 102e, which are formed via doping with impurities. The source region 120a, the drain region 120e, and the first doped region 120c may be doped, for example, to the same concentration of dopants, which may be N-type impurities or P-type impurities.

The first channel region 120b and the second channel region 120d, which are updoped regions, may be, for example, between the source region 120a and the first doped region 120c, and between the first doped region 120c and the drain region 120e, respectively. Doping of a region of the semiconductor layer 120, may be performed, for example, after the forming of a first gate electrode 141 and a second gate electrode 142, not immediately after the forming of the semiconductor layer 120. However, exemplary embodiments of the present invention are not limited thereto, but rather exemplary embodiments of the present embodiment may be varied in different forms.

After the forming of the semiconductor layer 120, a gate insulating layer 130 is formed using, for example, silicon oxide, silicon nitride, silicon oxynitride, hafnium oxide, aluminum oxide, zirconium oxide, titanium oxide, tantalum oxide, yttrium oxide, barium titanate, aluminum nitride, aluminum oxynitride, lead titanate, or other insulating organic inorganic materials to cover the semiconductor layer 120. Subsequently, the first gate electrode 141 and the second gate electrode 142 are, for example, formed on the gate insulating layer 130. The first gate electrode 141 and the second gate electrode 142 may have, for example, shapes protruding from a gate line 140 (in substantially the same plane). That is, the gate line 140, the first gate electrode 141, and the second gate electrode 142 may be formed, for example, as an integrated unit at the same time.

The first gate electrode 141 and the second gate electrode 142 may have a single-layer or multi-layer structure. When having a multi-layer structure, the first gate electrode 141 and the second gate electrode 142 may include, for example, a first lower gate electrode and a second lower gate electrode, each formed of a transmitting conductive material, and a first upper gate electrode and a second upper gate electrode, each formed of a high conductivity material thereon, respectively.

The first lower gate electrode and the second lower gate electrode may be formed of, for example, indium tin oxide (ITO), indium zinc oxide (IZO), zinc oxide (ZnO), indium oxide (In2O3), indium gallium oxide (IGO), aluminum zinc oxide (AZO) tin oxide (SnOx), gallium oxide (GaOx), cadmium zinc oxide (CZO), or indium gallium zinc oxide (IGZO). The first upper gate electrode or the second upper gate electrode may be formed as a single layer or a multi-layer from at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), zinc (Zn), cobalt (Co), manganese (Mn), iridium (Ir), rhodium (Rh), osmium (Os), tantalum (Ta), and/or an alloy thereof. When having a single-layer structure, the first gate electrode 141 and the second gate electrode 142 may be formed using these materials for forming the first upper gate electrode and the second upper gate electrode.

After the forming of the first gate electrode 141 and the second gate electrode 142 on the gate insulating layer 130, the regions of the semiconductor layer 120 that underlies the first gate electrode 141 and the second gate electrode 142, uncovered by the first gate electrode 141 and the second gate electrode 142, e.g., the source region 120a, the first doped region 120c, and the drain region 120e may be, for example, doped using the first gate electrode 141 and the second gate electrode 142 as masks.

The first gate electrode 141 and the second gate electrode 142, formed as described above, are insulated from the semiconductor layer 120 by the gate insulating layer 130. However, the first gate electrode 141 or the second gate electrode 142 may be partially lost during the forming of the thin gate insulating layer 130 or during the forming of the first gate electrode 141 or the second gate electrode 142, causing a short between the first gate electrode 141 or the second gate electrode 142 and the semiconductor layer 120. This may cause malfunctioning of a thin film transistor even after a source electrode or drain electrode is formed.

Conventionally the entire substrate including a thin film transistor with such a defect that has occurred during manufacturing of the thin film transistor is discarded, which consequentially may lower yield and increase manufacturing costs. Accordingly, after the forming of the first gate electrode 141 and the second gate electrode 142, there may be a need for an inspection to determine whether a short has occurred between the first and second gate electrodes and the semiconductor layer and to take appropriate measures to make the defective thin film transistor operate normally.

When a short occurs between the first gate electrode 141 and the semiconductor layer 120, as illustrated in FIG. 2, a first through hole 130a may be formed in a region of the gate insulating layer 130 between the first gate electrode 141 and the second gate electrode 142 to expose the semiconductor layer 120, for example, via any of various patterning methods. For example, the first through hole 130a may be formed using a laser ablation technique (LAT) in which a region of the gate insulating layer 130 is eliminated through, for example, ashing, by laser irradiation. The first through hole 130a may also be formed through, for example, etching using a photoresist.

Figure 3:
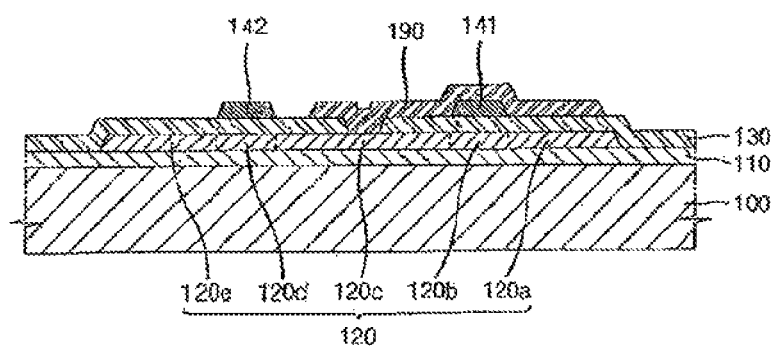

Next, referring to FIG. 3, a capping layer 190 is formed using a conductive material to cover the first gate electrode 141 and contact the semiconductor layer 120 via the first through hole. The capping layer 190 may be formed of any conductive material such as, for example, a material for forming the first gate electrode 141 or the second gate electrode 142.

Figure 4:
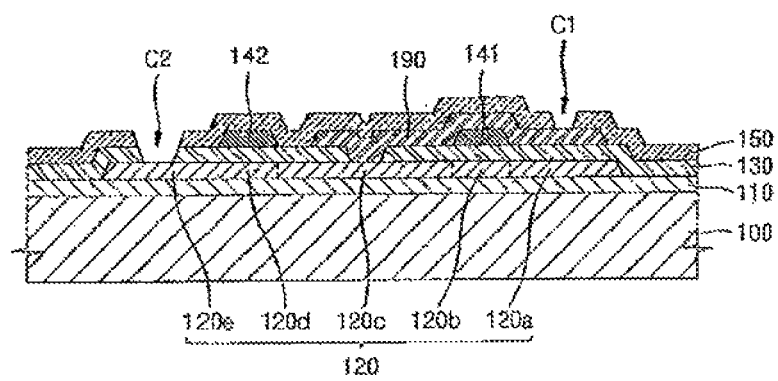

Referring to FIG. 4, an interlayer insulating layer 150 is formed of an insulating material, such as, for example, silicon oxide, silicon nitride, silicon oxynitride and/or other insulating organic inorganic materials on the gate insulating layer 130 to cover the capping layer 190 and the second gate electrode 142. Subsequently, contact holes C1 and C2 are formed, for example, in the interlayer insulating layer 150 and/or the gate insulating layer 130 to at least partially expose the source region 120a and the drain region 120e of the semiconductor layer 120, respectively.

Figure 5:
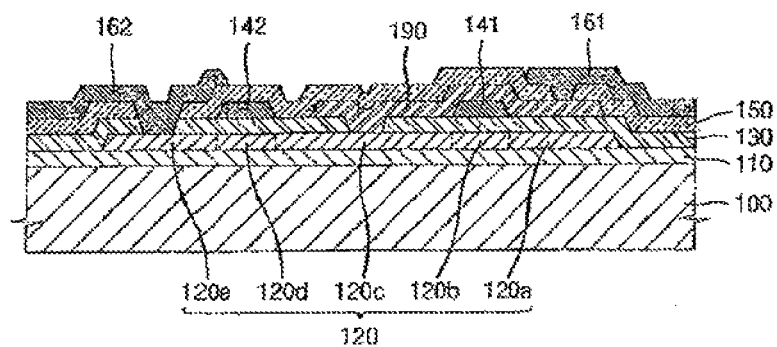

Referring to FIG. 5, a first electrode 161 and a second electrode 162 are formed. The first electrode 161 is located on a side of the first gate electrode 141 opposite to the second gate electrode 142, and contacts the capping layer 190. The second electrode 162 is located on a side of the second gate electrode 142 opposite to the first gate electrode 141, and contacts the semiconductor layer 120. The first electrode 161 may be, for example, a source electrode, and the second electrode 162 may be, for example, a drain electrode. In consideration of conductivity, the first electrode 161 and the second electrode 162 may be formed as a single layer or a multi-layer from, for example, at least one of aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and copper (Cu), zinc (Zn), cobalt (Co), manganese (Mn), iridium (Ir), rhodium (Rh), osmium (Os), tantalum (Ta), and/or an alloy thereof.

At least part of the semiconductor layer 120 may be used as, for example, a source electrode or a drain electrode through doping with impurities. In this regard, the source electrode or drain electrode may be patterned into a shape different from that illustrated in FIG. 5. This will apply to the following examples and modifications thereof.

In manufacturing a thin film transistor as described above, before the forming of the interlayer insulating layer 150 to cover the capping layer 190 covering the first gate electrode 141 and the second gate electrode 142, as illustrated in FIG. 4, the first gate electrode 141 electrically shorted from semiconductor layer 120 may be, for example, physically disconnected from the gate line 140 (refer to FIG. 1). For example, as illustrated in FIG. 2, after the forming of the first gate electrode 141 and the second gate electrode 142 and before the forming of the first through hole 130a in the gate insulating layer 130, the first gate electrode 141 may be physically disconnected from the gate line 140. However, alternatively, in an embodiment, after the forming of the first through hole 130a in the gate insulating layer 130, the first gate electrode 141 may be physically disconnected from the gate line 140. In an embodiment, during the forming of the first through hole 130a in the gate insulating layer 130, the first gate electrode 141 may be physically disconnected from the gate line 140. In an embodiment, after the forming of the capping layer 190 as illustrated in FIG. 3, the first gate electrode 141 may be physically disconnected from the gate line 140.

The first gate electrode 141 may be physically disconnected from the gate line 140 by any of various methods. For example, the first gate electrode 141 may be physically disconnected from the gate line 140 by eliminating a region between the first gate electrode 141 and the gate line 140 by laser radiation.

The thin film transistor of FIG. 5 manufactured as described above may operate normally even when a short occurs between the first gate electrode 141 and the semiconductor layer 120. For example, when a preset electrical signal is applied to the second gate electrode 142, a channel is formed in the second channel region 120d to electrically connect the drain region 120e and the first doped region 120c. The first doped region 120c contacts and is electrically connected to the capping layer 190 via the first through hole 130a in the gate insulating layer 130. The capping layer 190 contacts and is electrically connected to the first electrode 161. Consequently, the first electrode 161 and the second electrode 162 are electrically connected with each other, so that the thin film transistor may operate normally.

If the capping layer 190 is not present, a short may occur between the first gate electrode 141 and the semiconductor layer 120 even though the drain region 120e and the first doped region 120c are electrically connected via the channel in the second channel region 120d such that a channel in the first channel region 120b may not be formed, thereby disabling an electrical connection between the first electrode 161 and the second electrode 162. In this case, the thin film transistor may not operate normally.

In the thin film transistor manufacturing method according to the current embodiment described above, a thin film transistor which operates normally even when a short occurs between the first gate electrode 141 and the semiconductor layer 120 may be implemented at a higher yield and at significantly lower costs.

FIGS. 6 to 9 are schematic sectional views of a method of manufacturing a thin film transistor, according to an embodiment of the present invention.

Figure 6:
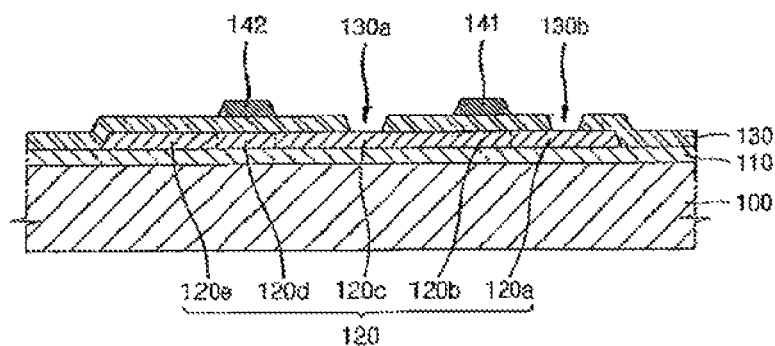
FIGS. 6 to 9 are schematic sectional views of a method of manufacturing a thin film transistor, according to an embodiment of the present invention.

Referring to FIG. 6, a semiconductor layer 120 is formed on a substrate 100. Before the forming of the semiconductor layer 120, a buffer layer 110 may be formed on the substrate 100. As described in the thin film transistor manufacturing method according to the previous methods described in connection with FIGS. 1-5, the semiconductor layer 120 may include, for example, a source region 120a, a first channel region 120b, a first doped region 120c, a second channel region 120d, and a drain region 120e.

After the forming of the semiconductor layer 120, a gate insulating layer 130 is formed to cover the semiconductor layer 120. Subsequently, the first gate electrode 141 and the second gate electrode 142 are formed on the gate insulating layer 130. The first gate electrode 141 and the second gate electrode 142 may have, for example, shapes protruding from a gate line 140 (on substantially the same plane). That is, the gate line 140, the first gate electrode 141, and the second gate electrode 142 may be formed as, for example, an integrated unit at the same time. Detailed descriptions of the first gate electrode 141 and the second gate electrode 142 are the same as those described above in the thin film transistor manufacturing method according to FIGS. 1-5.

The first gate electrode 141 and the second gate electrode 142, formed as described above, are insulated from the semiconductor layer 120 by the gate insulating layer 130. However, the first gate electrode 141 or the second gate electrode 142 may be partially lost during the forming of the thin gate insulating layer 130 or during the forming of the first gate electrode 141 or the second gate electrode 142, thereby causing a short between the first gate electrode 141 or the second gate electrode 142 and the semiconductor layer 120. This may cause malfunctioning of a thin film transistor even after a source electrode or drain electrode is formed.

When a short occurs between the first gate electrode 141 and the semiconductor layer 120, as illustrated in FIG. 6, a first through hole 130a exposing a region of the semiconductor layer 120 between the first gate electrode 141 and the second gate electrode 142, and a second through hole 130b exposing a region of the semiconductor layer 120 on a side of the first gate electrode 141 opposite to the second gate electrode 142 may be formed in the gate insulating layer 130, for example, via any of various patterning methods. For example, the first through hole 130a and the second through hole 130b may be formed by laser irradiation onto a corresponding region of the gate insulating layer 130 to eliminate the irradiated region through, for example, ashing. The first through hole 130a and the second through hole 130b may also be formed through, for example, etching using a photoresist.

Figure 7:
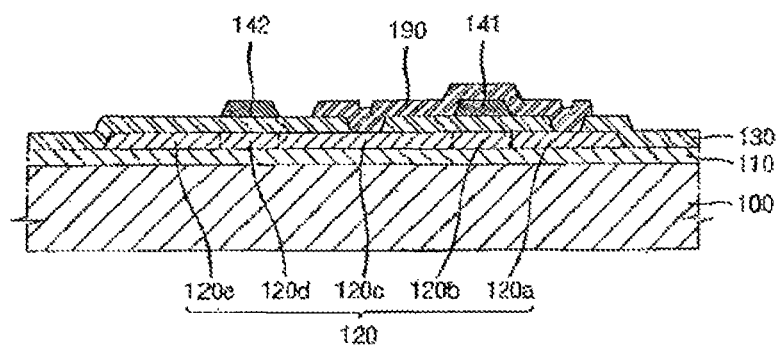

Next, referring to FIG. 7, a capping layer 190 is formed, for example, using a conductive material to cover the first gate electrode 141 and contact the semiconductor layer 120 via the first through hole 130a and the second through hole 130b. The capping layer 190 may be formed of any conductive material such as, for example, a material for forming the first gate electrode 141 or the second gate electrode 142.

Figure 8:
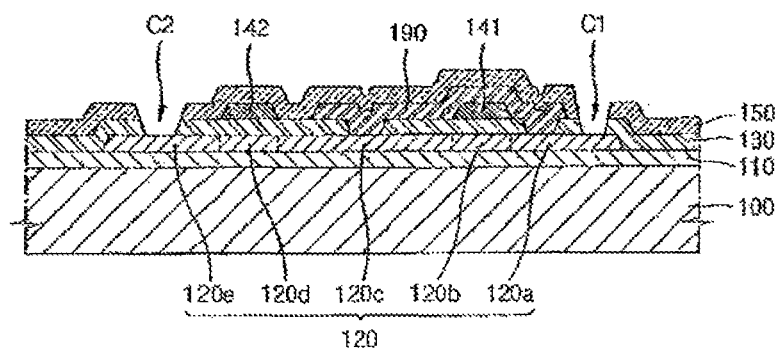

Next, referring to FIG. 8, an interlayer insulating layer 150 is formed on the gate insulating layer 130 to cover the capping layer 190 and the second gate electrode 142. Subsequently, contact holes C1 and C2 are formed, for example, in the interlayer insulating layer 150 and/or the gate insulating layer 130 to at least partially expose the source region 120a and the drain region 120e of the semiconductor layer 120, respectively.

Figure 9:
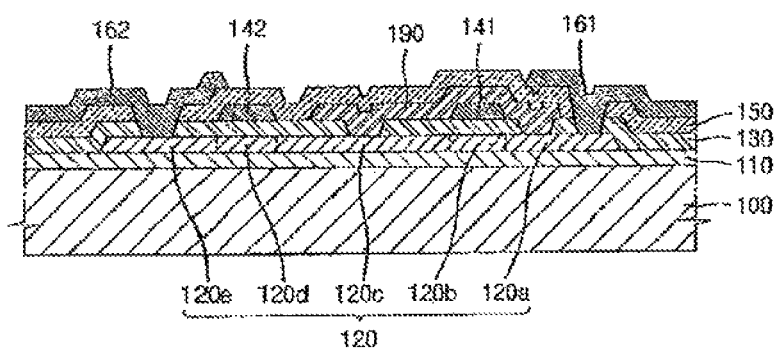

Referring to FIG. 9, a first electrode 161 and a second electrode 162 are formed. The first electrode 161 is located, for example, on a side of the first gate electrode 141 opposite to the second gate electrode 141, and contacts the source region 120a of the semiconductor layer 120. The second electrode 162 is located, for example, on a side of the second gate electrode 142 opposite to the first gate electrode 141, and contacts the drain region 120e of the semiconductor layer 120. The first electrode 161 may be, for example, a source electrode, and the second electrode 162 may be, for example, a drain electrode.

In manufacturing a thin film transistor as described above, before the forming of the interlayer insulating layer 150 to cover the capping layer 190 covering the first gate electrode 141 and the second gate electrode 142, as illustrated in FIG. 8, the first gate electrode 141 electrically shorted from semiconductor layer 120 may be physically disconnected from the gate line 140 (refer to FIG. 1). For example, as illustrated in FIG. 6, after the forming of the first gate electrode 141 and the second gate electrode 142 and before the forming of the first through hole 130a and the second through hole 130b in the gate insulating layer 130, the first gate electrode 141 may be physically disconnected from the gate line 140. Alternatively, for example, in an embodiment, after the forming of the first through hole 130a and the second through hole 130b in the gate insulating layer 130, the first gate electrode 141 may be physically disconnected from the gate line 140. In an embodiment, during the forming of the first through hole 130a and the second through hole 130b in the gate insulating layer 130, the first gate electrode 141 may be physically disconnected from the gate line 140. In an embodiment, after the forming of the capping layer 190 as illustrated in FIG. 7, the first gate electrode 141 may be physically disconnected from the gate line 140.

The first gate electrode 141 may be physically disconnected from the gate line 140 by any of various methods. For example, the first gate electrode 141 may be physically disconnected from the gate line 140 by eliminating a region between the first gate electrode 141 and the gate line 140 by laser irradiation.

The thin film transistor of FIG. 9 manufactured as described above may normally operate even when a short occurs between the first gate electrode 141 and the semiconductor layer 120. For example, when a preset electrical signal is applied to the second gate electrode 142, a channel is formed in the second channel region 120d to electrically connect the drain region 120e and the first doped region 120c. The first doped region 120c contacts and is electrically connected to the capping layer 190 via the first through hole 130a in the gate insulating layer 130. The capping layer 190 contacts and is electrically connected to the source region 120a of the semiconductor layer 120 via the second through hole in the gate insulating layer 130. Consequently, the first doped region 120c and the source region 120a are electrically connected with each other, so that the thin film transistor may operate normally.

If the capping layer 190 is not present, a short may occur between the first gate electrode 141 and the semiconductor layer 120 even though the drain region 120e and the first doped region 120c are electrically connected via the channel in the second channel region 120d, such that a channel in the first channel region 120b may not be formed, thereby disabling an electrical connection between the first electrode 161 and the second electrode 162. In this case, the thin film transistor may not operate normally.

In the thin film transistor manufacturing method according to the present embodiment described above, a thin film transistor may be operated normally even with a short occurring between the first gate electrode 141 and the semiconductor layer 120 and the thin film transistor may also be implemented at a higher yield and at significantly lower costs.

Figure 10:
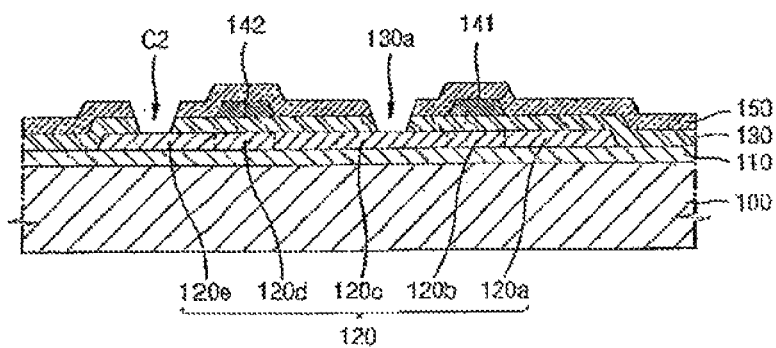
FIGS. 10 and 11 are schematic sectional views of a method of manufacturing a thin film transistor, according to an embodiment of the present invention.
Figure 11:
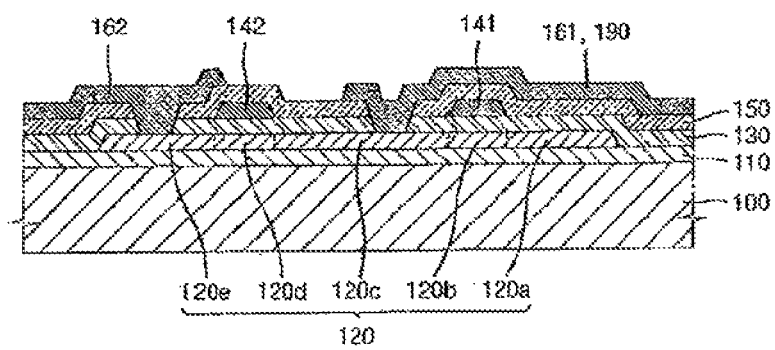

FIGS. 10 and 11 are schematic sectional views of a method of manufacturing a thin film transistor, according to an embodiment of the present invention;

Referring to FIG. 10, a semiconductor layer 120 is formed on a substrate 100. Before the forming of the semiconductor layer 120, a buffer layer 110 may be formed on the substrate 100. As described in the thin film transistor manufacturing method according to the previous methods described in connection with FIGS. 1-5 and 6-9, the semiconductor layer 120 may include, for example, a source region 120a, a first channel region 120b, a first doped region 120c, a second channel region 120d, and a drain region 120e.

After the forming of the semiconductor layer 120, a gate insulating layer 130 is formed to cover the semiconductor layer 120. Subsequently, a first gate electrode 141 and a second gate electrode 142 are formed on the gate insulating layer 130. The first gate electrode 141 and the second gate electrode 142 may have, for example, shapes protruding from a gate line 140 (in substantially the same plane). That is, the gate line 140, the first gate electrode 141, and the second gate electrode 142 may be formed as, for example, an integrated unit at the same time. Detailed descriptions of the first gate electrode 141 and the second gate electrode 142 are the same as those described above in the thin film transistor manufacturing method according to the previous methods described in connection with FIGS. 1-5 and 6-9. Next, an interlayer insulating layer 150 is formed on the gate insulating layer 130 to cover the first gate electrode 141 and the second gate electrode 142.

The first gate electrode 141 and the second gate electrode 142, formed as described above, are insulated from the semiconductor layer 120 by the gate insulating layer 130. However, the gate insulating layer 130 as a thin film may be partially lost during the forming of the gate insulating layer 130 or during the forming of the first gate electrode 141 or the second gate electrode 142, thereby causing a short between the first gate electrode 141 or the second gate electrode 142 and the semiconductor layer 120. This may cause malfunctioning of a thin film transistor even after a source electrode or drain electrode is formed.

When a short occurs between the first gate electrode 141 and the semiconductor layer 120, a first through hole 130a may be formed in a region of the gate insulating layer 130 and the interlayer insulating layer 150 between the first gate electrode 141 and the second gate electrode 142 to expose the semiconductor layer 120, as illustrated in FIG. 10. This process may be performed, for example, at the same time as forming a contact hole C2 on a side of the second gate electrode 142 opposite to the first gate electrode 141 to expose at least part of the drain region 120e of the semiconductor layer 120. The forming of the first through hole 130a and the contact hole C2 may be performed by, for example, etching using a photoresist, or a LAT of eliminating a target region by laser irradiation.

Next, referring to FIG. 11, a capping layer 190 is formed of, for example, a conductive material to cover a region of the interlayer insulating layer 150 corresponding to the first gate electrode 141 and to contact the semiconductor layer 120 via the first through hole 130a. As illustrated in FIG. 11, a first electrode 161, which is located on a side of the first gate electrode 141 opposite to the second gate electrode 142 and contacts the capping layer 190, and a second electrode 162, which is located on a side of the second gate electrode 142 opposite to the first gate electrode 141, and contacts the semiconductor layer 120, may be formed, for example, simultaneously with the capping layer 190 of the same material. In an embodiment, as illustrated in FIG. 11, the capping layer 190 and the first electrode 161 may be formed as, for example, an integrated unit.

In manufacturing a thin film transistor as described above, before the forming of the interlayer insulating layer 150 to cover the first gate electrode 141 and the second gate electrode 142, as illustrated in FIG. 10, the first gate electrode 141 electrically shorted from semiconductor layer 120 may be physically disconnected from the gate line 140 (refer to FIG. 1). The first gate electrode 141 may be physically disconnected from the gate line 140 by any of various methods. For example, the first gate electrode 141 may be physically disconnected from the gate line 140 by eliminating a region between the first gate electrode 141 and the gate line 140 by laser irradiation.

The thin film transistor of FIG. 11 manufactured as described above may operate normally even when a short occurs between the first gate electrode 141 and the semiconductor layer 120. For example, when a preset electrical signal is applied to the second gate electrode 142, a channel is formed in the second channel region 120d to electrically connect the drain region 120e and the first doped region 120c. The first doped region 120c contacts and is electrically connected to the capping layer 190 via the first through hole 130a in the gate insulating layer 130 and the interlayer insulating layer 150. The capping layer 190 contacts and is electrically connected to the first electrode 161. Consequently, the first electrode 161 and the second electrode 162 are electrically connected with each other, so that the thin film transistor may operate normally.

If the capping layer 190 is not present, a short may occur between the first gate electrode 141 and the semiconductor layer 120 even though the drain region 120e and the first doped region 120c are electrically connected via the channel in the second channel region 120d such that a channel in the first channel region 120b may not be formed, thereby disabling an electrical connection between the first electrode 161 and the second electrode 162. In this case, the thin film transistor may not operate normally.

In the thin film transistor manufacturing method according to the present embodiment described above, a thin film transistor which operates normally even when a short occurs between the first gate electrode 141 and the semiconductor layer 120 may be implemented at a higher yield and at significantly lower costs.

Figure 12:
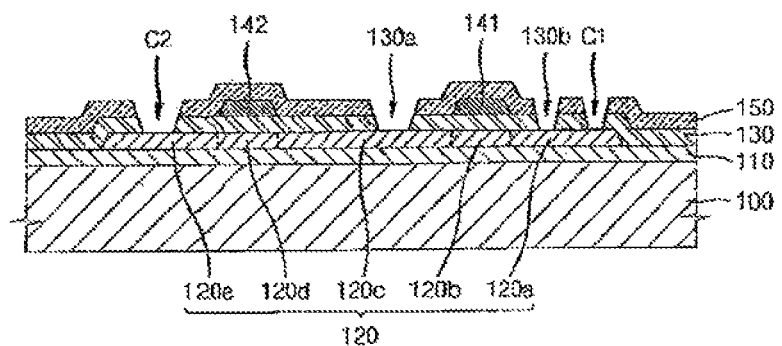
FIGS. 12 and 13 are schematic sectional views of a method of manufacturing a thin film transistor, according to an embodiment of the present invention.
Figure 13:
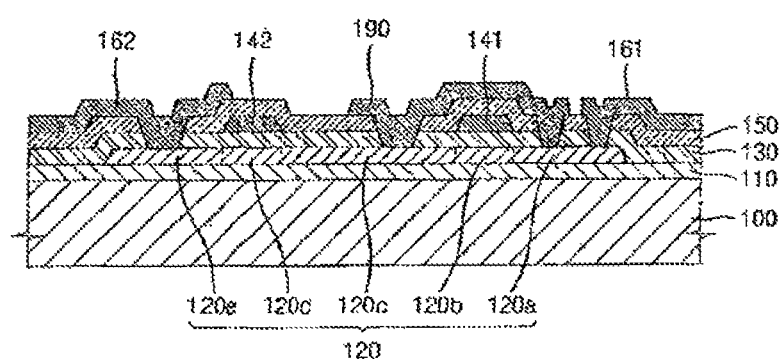

FIGS. 12 and 13 are schematic sectional views of a method of manufacturing a thin film transistor, according to an embodiment of the present invention.

Referring to FIG. 12, a semiconductor layer 120 is formed on a substrate 100. Before the forming of the semiconductor layer 120, a buffer layer 110 may be formed on the substrate 100. As described in the thin film transistor manufacturing methods according to FIGS. 1-5, 6-9 and 10-11, the semiconductor layer 120 may include, for example, a source region 120a, a first channel region 120b, a first doped region 120c, a second channel region 120d, and a drain region 120e.

After the forming of the semiconductor layer 120, a gate insulating layer 130 is formed to cover the semiconductor layer 120. Subsequently, the first gate electrode 141 and the second gate electrode 142 are formed on the gate insulating layer 130. The first gate electrode 141 and the second gate electrode 142 may have, for example, shapes protruding from a gate line 140 (on substantially the same plane). That is, the gate line 140, the first gate electrode 141, and the second gate electrode 142 may be formed as, for example, an integrated unit at the same time. Detailed descriptions of the first gate electrode 141 and the second gate electrode 142 are the same as those described above in the thin film transistor manufacturing methods according to FIGS. 1-5, 6-9 and 10-11. Next, an interlayer insulating layer 150 is formed on the gate insulating layer 130 to cover the first gate electrode 141 and the second gate electrode 142.

The first gate electrode 141 and the second gate electrode 142, formed as described above, are insulated from the semiconductor layer 120 by the gate insulating layer 130. However, the first gate electrode 141 or the second gate electrode 142 may be partially lost during the forming of the thin gate insulating layer 130 or during the forming of the first gate electrode 141 or the second gate electrode 142, thereby causing a short between the first gate electrode 141 or the second gate electrode 142 and the semiconductor layer 120. This may cause malfunctioning of a thin film transistor even after a source electrode or drain electrode is formed.

When a short occurs between the first gate electrode 141 and the semiconductor layer 120, a first through hole 130a exposing a region of the semiconductor layer 120 between the first gate electrode 141 and the second gate electrode 142, and a second through hole 130b exposing at least part of the source region 120a of the semiconductor layer 120 on a side of the first gate electrode 141 opposite to the second gate electrode 142 may be formed in the gate insulating layer 130 and the interlayer insulating layer 150, as illustrated in FIG. 12. This process may be performed, for example, simultaneously with forming a contact hole C2 on a side of the second gate electrode 142 opposite to the first gate electrode 141 to expose at least part of the drain region 120e of the semiconductor layer 120, and forming a contact hole C1 on a side of the second through hole 130b opposite to the first gate electrode 141 to expose at least part of the drain region 120e of the semiconductor layer 120. The forming of the first through hole 130a, the second through hole 130b, and the contact holes C1 and C2 may be performed by, for example, etching using a photoresist, or a LAT of eliminating a target region by laser irradiation.

Next, referring to FIG. 13, a capping layer 190 is formed using, for example, a conductive material to cover a region of the interlayer insulating layer 150 corresponding to the first gate electrode 141 and to contact the semiconductor layer 120 via the first through hole 130a and the second through hole 130b. As illustrated in FIG. 13, a first electrode 161, which is located on a side of the second through hole 130b opposite to the first gate electrode 141, and contacts the semiconductor layer 120, and a second electrode 162, which is located on a side of the second gate electrode 142 opposite to the first gate electrode 141, and contacts the semiconductor layer 120, may be formed, for example, simultaneously with the capping layer 190 of the same material. As opposed to the illustration of FIG. 11, the capping layer 190 and the first electrode 161 may be formed, for example, as one body.

In manufacturing a thin film transistor as described above, before the forming of the interlayer insulating layer 150 to cover the first gate electrode 141 and the second gate electrode 142, as illustrated in FIG. 12, the first gate electrode 141 electrically shorted from semiconductor layer 120 may be physically disconnected from the gate line 140 (refer to FIG. 1). The first gate electrode 141 may be physically disconnected from the gate line 140 by any of various methods. For example, the first gate electrode 141 may be physically disconnected from the gate line 140 by eliminating a region between the first gate electrode 141 and the gate line 140 by laser irradiation.

The thin film transistor of FIG. 13 manufactured as described above may operate normally even when a short occurs between the first gate electrode 141 and the semiconductor layer 120. For example, when a preset electrical signal is applied to the second gate electrode 142, a channel is formed in the second channel region 120d to electrically connect the drain region 120e and the first doped region 120c. The first doped region 120c contacts and is electrically connected to the capping layer 190 via the first through hole 130a in the gate insulating layer 130 and the interlayer insulating layer 150. The capping layer 190 contacts and is electrically connected to the source region 120a of the semiconductor layer 120 through the second through hole 130b in the gate insulating layer 130 and the interlayer insulating layer 150. Consequently, the first electrode 161 and the second electrode 162 are electrically connected, so that the thin film transistor may operate normally.

If the capping layer 190 is not present, a short may occur between the first gate electrode 141 and the semiconductor layer 120 even though the drain region 120e and the first doped region 120c are electrically connected via the channel in the second channel region 120d such that a channel in the first channel region 120b may not be formed, thereby disabling an electrical connection between the first electrode 161 and the second electrode 162. In this case, the thin film transistor may not operate normally.

In the thin film transistor manufacturing method according to the present embodiment described above, a thin film transistor which may operate normally even with a short occurring between the first gate electrode 141 and the semiconductor layer 120 may be implemented at a higher yield and at significantly lower costs.

Although only the methods of manufacturing thin film transistors are described so far, embodiments of the present invention are not limited thereto, and the thin film transistors manufactured by the methods also pertain to embodiments of the present invention.

For example, a thin film transistor according to an embodiment of the present invention may have a structure as illustrated in FIG. 5. Referring to FIG. 5, the thin film transistor according to an embodiment of the present invention includes, for example, a semiconductor layer 120 disposed on a substrate 100, a first gate electrode 141 and a second gate electrode 142 disposed on the semiconductor layer 120, a gate insulating layer 130 disposed between the semiconductor layer 120 and the first gate electrode 141 and second gate electrode 142, and having a first through hole between the first gate electrode 141 and the second gate electrode 142, and a capping layer 190 that covers the first gate electrode 141, contacts the semiconductor layer 120 via the first through hole, and includes a conductive material The semiconductor layer 120 may include, for example, a source region 120a, a first channel region 120b, a first doped region 120c, a second channel region 120d, and a drain region 120e, as illustrated in FIG. 5. The capping layer 190 may contact the first doped region 120c of the semiconductor layer 120. Due to this structure of the thin film transistor, even when a short occurs between the first gate electrode 141 and the semiconductor layer 120, if an electrical signal is applied to the second gate electrode 142 to form a channel in the second channel region 120d, a first electrode 161 and a second electrode 162 may be electrically connected via the first doped region 120c, the second channel region 120d, and the drain region 120e. Accordingly, the first electrode 161 as a source electrode, which is located on a side of the first gate electrode 141 opposite to the second gate electrode 142 and contacts the capping layer 190, and the second electrode 162 as a drain electrode, which is located on a side of the second gate electrode 142 opposite to the first gate electrode 141 and contacts the drain region 120e of the semiconductor layer 120, may be electrically connected to each other. Thus, the thin film transistor may operate normally even when a short occurs between the first gate electrode 141 and the semiconductor electrode 120.

A precondition for this achievement is that the first gate electrode 141 electrically shorted from the semiconductor layer 120 should be physically disconnected from the gate line 140.

A thin film transistor according to an embodiment of the present invention may have a structure as illustrated in FIG. 9. Unlike the thin film transistor according to the thin film transistor described with reference to FIG. 5, a gate insulating layer 130 in the present embodiment, may have, for example, a second through hole on a side of the first gate electrode 141 opposite to the second gate electrode 142, and a capping layer 190 may contact a source region 120a of the semiconductor layer 120 via the second through hole.

Due to this structure of the thin film transistor, even when a short occurs between the first gate electrode 141 and the semiconductor layer 120, if an electrical signal is applied to the second gate electrode 142 to form a channel in the second channel region 120d, a first electrode 161 and a second electrode 162 may be electrically connected to each other via the source region 120a, the capping layer 190, the first doped region 120c, the second channel region 120d, and the drain region 120e. Accordingly, the first electrode 161 as a source electrode, which is located on a side of the second through hole opposite to the first gate electrode 141 and contacts the source region 120a of the semiconductor layer 120, and the second electrode 162 as a drain electrode, which is located on a side of the second gate electrode 142 opposite to the first gate electrode 141 and contacts the drain region 120e of the semiconductor layer 120, may be electrically connected to each other. Thus, the thin film transistor may operate normally even when a short occurs between the first gate electrode 141 and the semiconductor electrode 120.

A thin film transistor according to an embodiment of the present invention may have a structure as illustrated in FIG. 11.

A difference between the thin film transistor according to the present embodiment and the thin film transistor described with reference to FIG. 5 is the location of the capping layer 190. In the thin film transistor of FIG. 11 according to the present embodiment, the capping layer 190 is located on, for example, an interlayer insulating layer 150 to cover a region of the interlayer insulating layer 150 corresponding to a first gate electrode 141. Furthermore, a third through hole corresponding to the first through hole of the gate insulating layer 130 is formed in the interlayer insulating layer 150, so that the capping layer 190 on the interlayer insulating layer 150 may contact a region of the semiconductor layer 120 between the first gate electrode 141 and the second gate electrode 142 via the first through hole and the third through hole.

Due to this structure, a first electrode 161 as a source electrode, which is located on a side of the first gate electrode 141 opposite to the second gate electrode 142 and contacts the capping layer 190, and a second electrode 162 as a drain electrode, which is located on a side of the second gate electrode 142 opposite to the first gate electrode 141 and contacts the semiconductor layer 120, may be electrically connected to each other. Accordingly, the thin film transistor may operate normally even when a short occurs between the first gate electrode 141 and the semiconductor electrode 120. In this regard, as illustrated in FIG. 11, the capping layer 190 and the first electrode 161 may be formed as, for example, an integrated unit, and may be formed, for example, simultaneously with the second electrode 162 of the same material.

A thin film transistor according to an embodiment of the present invention may have a structure as illustrated in FIG. 13. In the thin film transistor of FIG. 13 according to the present embodiment, unlike the thin film transistor described with reference to FIG. 11, a gate insulating layer 130 includes, for example, a through hole on a side of the first gate electrode 141 opposite to the second gate electrode 142, an interlayer insulating layer 150 includes a fourth through hole corresponding to the second through hole of the gate insulating layer 130, and a capping layer 190 contacts the semiconductor layer 120 via the second through hole and the fourth through hole. Due to this structure, if an electrical signal is applied to the second gate electrode 142 to form a channel in a second channel region 120d of the semiconductor layer 120, a first electrode 161 as a source electrode, which is located on a side of the second through hole opposite to the first gate electrode 142 and contacts the semiconductor layer 120, and a second electrode 162 as a drain electrode, which is located on a side of the second gate electrode 142 opposite to the first gate electrode 141 and contacts the semiconductor layer 120, may be smoothly electrically connected to each other.

In the above-described structure of the thin film transistor, the first electrode 161 as a source electrode, the second electrode 162 as a drain electrode, and the capping layer may be formed of, for example, the same material at the same time.

Figure 14:
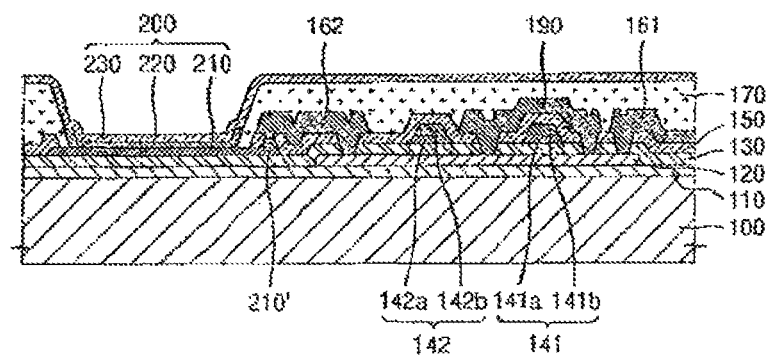
FIG. 14 is a schematic sectional view of an organic light-emitting display apparatus, according to an embodiment of the present invention.

FIG. 14 is a schematic sectional view of an organic light-emitting display apparatus, according to an embodiment of the present invention. An organic light-emitting display apparatus according to an embodiment of the present invention may include any of the thin film transistors according to FIGS. 5, 9, 11 and 13 and other modified thin film transistors in accordance with embodiments of the present invention. The organic light-emitting display apparatus of FIG. 14 includes a thin film transistor as described above with reference to FIG. 13.

As shown in FIG. 14, the thin film transistor may operate normally even when a short occurs between the first gate electrode 141 and the semiconductor layer 120. Accordingly, an organic light-emitting device 200 electrically connected to the thin film transistor may be appropriately controlled to emit light normally.

Referring to FIG. 14, the organic light-emitting apparatus includes, for example, a pixel defining layer 170 that covers the thin film transistor and an edge of a pixel electrode 210 to expose a center region of the pixel electrode 210, an intermediate layer 220 that is disposed in a region of the pixel electrode 210 exposed by the pixel defining layer 170 and includes an emission layer, and an opposite electrode 230 corresponding to the entire surface of a substrate 100. Although the intermediate layer 220 is illustrated as a pattern corresponding to a region of the pixel electrode 210 in FIG. 14, embodiments of the present invention are not limited thereto. For example, various layers in the intermediate layer 220, including a hole injection layer (HIL), a hole transport layer (HTL), an electron transport layer (ETL), and an electron injection layer (EIL), may be at least partially integrated in a display area. As another example, the emission layer (EML) in the intermediate layer 220 may have, for example, a pattern corresponding to each pixel electrode 210.

As illustrated in FIG. 14, the first gate electrode 141 and the second gate electrode 142 may be disposed on, for example, the same layer as the pixel electrode 210. In the present embodiment of FIG. 14, the first gate electrode 141 and the second gate electrode 142 may have, for example, a multi-layer structure including a first lower gate electrode 141a and a first upper gate electrode 141b, and a multi-layer structure including a second lower gate electrode 142a and a second upper gate electrode 142b, respectively. In this regard, the first and second lower gate electrodes 141a and 142a, which may be formed of, for example, a transmitting conductive material, may be formed at the same time using the same material. The first and second upper gate electrodes 141b and 142b, which may be formed on the first lower gate electrode 141a and the second lower gate electrode 142a, respectively, using, for example, a highly conductive material, may be formed as a unit integrated with an auxiliary pixel electrode 210' on a region of the pixel electrode 210. Consequently, the overall manufacturing process may be simplified, and the manufacturing yield may be increased.

Further to the organic light-emitting display apparatus, any display apparatus including a thin film transistor and a display device (for example, a liquid crystal display (LCD) device) electrically connected thereto also pertains to exemplary embodiments the present invention.

As described above, according to embodiments of the present invention, a thin film transistor that may operate normally even when a partial insulation defect occurs in a dual-gate thin film transistor may be manufactured using a method as described above. A display apparatus may be manufactured using the thin film transistor.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A method of manufacturing a thin film transistor, comprising:

forming a single, continuous semiconductor layer on a substrate;

forming a gate insulating layer covering the semiconductor layer;

forming a first gate electrode and a second gate electrode on the gate insulating layer over the single, continuous semiconductor layer;

forming a first through hole in a region of the gate insulating layer between the first gate electrode and the second gate electrode exposing the semiconductor layer; and forming a capping layer including a conductive material covering the first gate electrode and contacting the semiconductor layer via the first through hole, wherein the forming of the first through hole in the gate insulating layer comprises forming the first through hole in the region of the gate insulating layer between the first gate electrode and the second gate electrode exposing the semiconductor layer, and a second through hole in a region of the gate insulating layer on a side of the first gate electrode opposite to the second gate electrode exposing the semiconductor layer, and wherein the forming of the capping layer comprises forming the capping layer including the conductive material covering the first gate electrode end contacting the semiconductor layer through the first through hole and the second through hole, the method further comprising forming a first electrode that is located on a side of the second through hole opposite to the first gate electrode and contacting the semiconductor layer, and a second electrode located on a side of the second gate electrode opposite to the first gate electrode and contacting the semiconductor layer.

2. The method of claim 1, wherein the single, continuous semiconductor layer includes a source region, a first channel region, a first doped region, a second channel region, and a drain region, and wherein the first doped region has a first edge aligned with an edge of the first gate electrode and a second edge aligned with an edge of the second gate electrode, and the first doped region is continuously disposed between the first and second edges thereof.

3. A method of manufacturing a thin film transistor, comprising:

forming a semiconductor layer on a substrate;

forming a gate insulating layer covering the semiconductor layer;

forming a first gate electrode and a second gate electrode on the gate insulating layer;

forming a first through hole in a region of the gate insulating layer between the first gate electrode and the second gate electrode exposing the semiconductor layer;

forming a capping layer including a conductive material covering the first gate electrode and contacting the semiconductor layer via the first through hole; and physically disconnecting the first gate electrode from a gate line.

4. The method of claim 3, wherein the physically disconnecting of the first gate electrode from the gate line is performed using a laser beam.

5. A method of manufacturing a thin film transistor, comprising:

forming a single, continuous semiconductor layer on a substrate;

forming a gate insulating layer covering the single, continuous semiconductor layer;

forming a first gate electrode and a second gate electrode on the gate insulating layer;

forming an interlayer insulating layer covering the first gate electrode and the second gate electrode;

forming a first through hole in a region of the gate insulating layer and the interlayer insulating layer between the first gate electrode and the second gate electrode exposing the semiconductor layer; and forming a capping layer including a conductive material covering a region of the interlayer insulating layer corresponding to the first gate electrode and contacting the semiconductor layer via the first through hole, wherein the forming of the first through hole in the gate insulating layer and the interlayer insulating layer comprises forming the first through hole in the region of the gate insulating layer and the interlayer insulating layer between the first gate electrode and the second gate electrode exposing the semiconductor layer, and a second through hole in a region of the gate insulating layer and the interlayer insulating layer on a side of the first gate electrode opposite to the second gate electrode exposing the semiconductor layer, and wherein the forming of the capping layer comprises forming the capping layer including the conductive material covering the region of the interlayer insulating layer corresponding to the first gate electrode and contacting the semiconductor layer via the first through hole and the second through hole, the method further comprising forming a first electrode located on a side of the second through hole opposite to the first gate electrode and contacting the semiconductor layer, and a second electrode located on a side of the second gate electrode opposite to the first gate electrode and contacting the semiconductor layer.

6. The method of claim 5, wherein the forming of the capping layer and the forming of the first electrode and the second electrode are performed at the same time as each other.

7. The method of claim 5, wherein the semiconductor layer includes a source region, a first channel region, a first doped region, a second channel region, and a drain region, and wherein the first doped region has a first edge aligned with an edge of the first gate electrode and a second edge aligned with an edge of the second gate electrode, and the first doped region is continuously disposed between the first and second edges thereof.

8. A method of manufacturing a thin film transistor, comprising:

forming a semiconductor layer on a substrate;

forming a gate insulating layer covering the semiconductor layer;

forming a first gate electrode and a second gate electrode on the gate insulating layer;

forming an interlayer insulating layer covering the first gate electrode and the second gate electrode;

forming a first through hole in a region of the gate insulating layer and the interlayer insulating layer between the first gate electrode and the second gate electrode exposing the semiconductor layer;

forming a capping layer including a conductive material covering a region of the interlayer insulating layer corresponding to the first gate electrode and contacting the semiconductor layer via the first through hole; and physically disconnecting the first gate electrode from a gate line.

9. The method of claim 8, wherein the physically disconnecting of the first gate electrode from the gate line is performed using a laser beam.

* * * * *